(12) United States Patent
Nagai et al.

(10) Patent No.: US 8,142,960 B2
(45) Date of Patent: Mar. 27, 2012

(54) EXPOSURE METHOD, MASK DATA PRODUCING METHOD, AND SEMICONDUCTOR DEVICE MANUFACTURING METHOD

(75) Inventors: Satoshi Nagai, Kawasaki (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 400 days.

(21) Appl. No.: 12/536,758

(22) Filed: Aug. 6, 2009

(65) Prior Publication Data

US 2010/0035167 A1    Feb. 11, 2010

(30) Foreign Application Priority Data

Aug. 8, 2008   (JP) ................................. 2008-205279

(51) Int. Cl.
G03F 9/00       (2006.01)
G06F 17/50      (2006.01)
(52) U.S. Cl. ................................. 430/5; 430/30; 716/53
(58) Field of Classification Search ................ 430/5, 30; 716/53
See application file for complete search history.

(56) References Cited

U.S. PATENT DOCUMENTS

| 6,208,748 | B1 | 3/2001 | Troccolo et al. | |
| 6,880,135 | B2 * | 4/2005 | Chang et al. | 700/121 |
| 7,213,226 | B2 | 5/2007 | Kotani et | |

FOREIGN PATENT DOCUMENTS

| JP | 11-307431 | 11/1999 |
| JP | 2002-184675 | 6/2002 |
| JP | 2004-47755 | 2/2004 |
| JP | 2004-103674 | 4/2004 |
| JP | 2006-73709 | 3/2006 |
| JP | 2006-344648 | 12/2006 |

OTHER PUBLICATIONS

Nagai, S. et al., "Exposure Method and Semiconductor Device Manufacturing Method," U.S. Appl. No. 12/423,595, filed Apr. 14, 2009.
Notification of Reasons for Rejection issued by the Japanese Patent Office on Nov. 2, 2010, for Japanese Patent Application No. 2008-205279, and English-language translation thereof.

* cited by examiner

*Primary Examiner* — Christopher Young
(74) *Attorney, Agent, or Firm* — Finnegan, Henderson, Farabow, Garrett & Dunner, L.L.P.

(57) ABSTRACT

An exposure method has irradiating a mask with light based on an exposure performing condition, a first mask pattern and a second mask pattern being formed in the mask, and projecting images of the first mask pattern and second mask pattern onto a wafer through a projection lens, a lower-layer film material and a photoresist being sequentially laminated on the wafer, wherein the exposure performing condition is a condition on which, when exposure is performed on a predetermined exposure condition, the predetermined exposure condition is adjusted such that a difference between a wafer position at which a best focus is obtained for the image of the first mask pattern and a wafer position at which a best focus is obtained for the image of the second mask pattern falls within a predetermined range, the wafer position of the first mask pattern and the wafer position of the second mask pattern being predicted using film thicknesses and optical characteristics of the photoresist and the lower-layer film material.

7 Claims, 5 Drawing Sheets

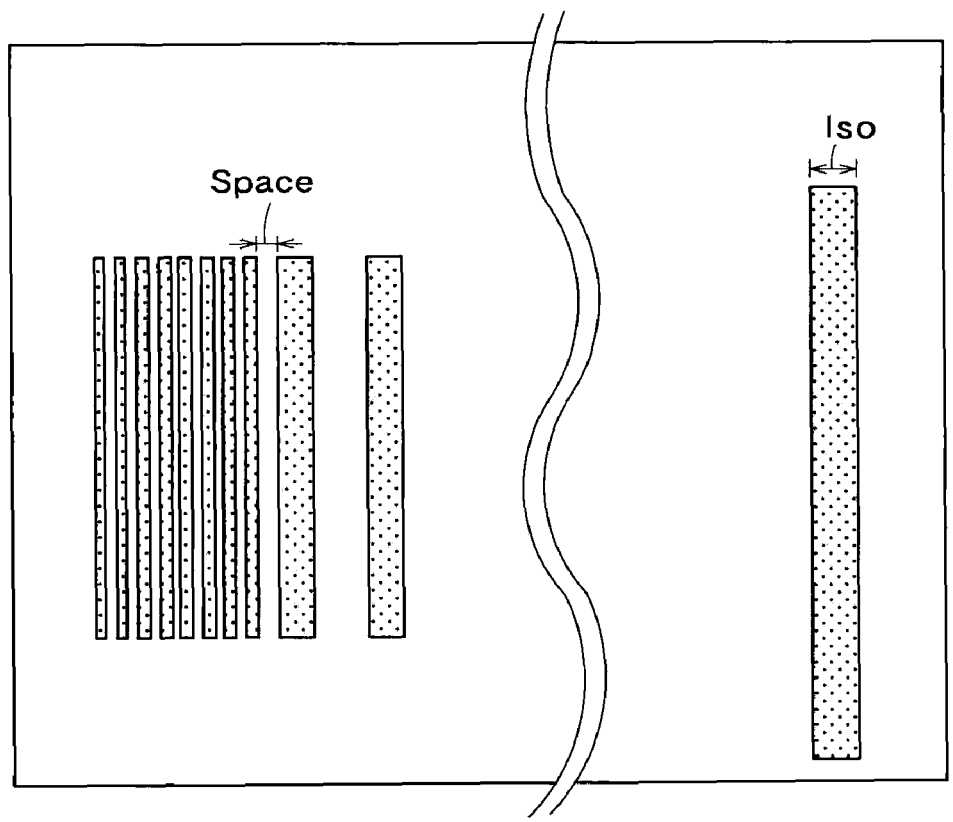
F I G. 3
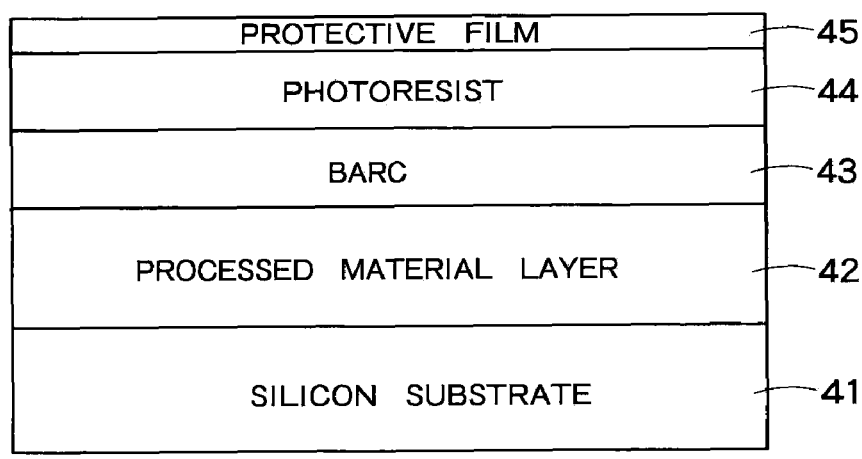
F I G. 4

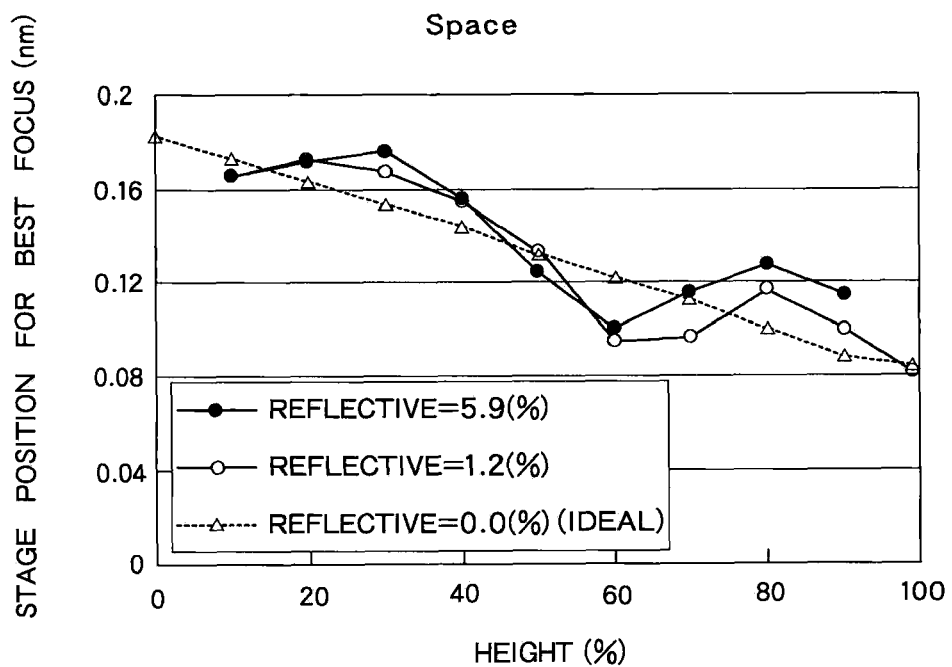
F I G. 5A
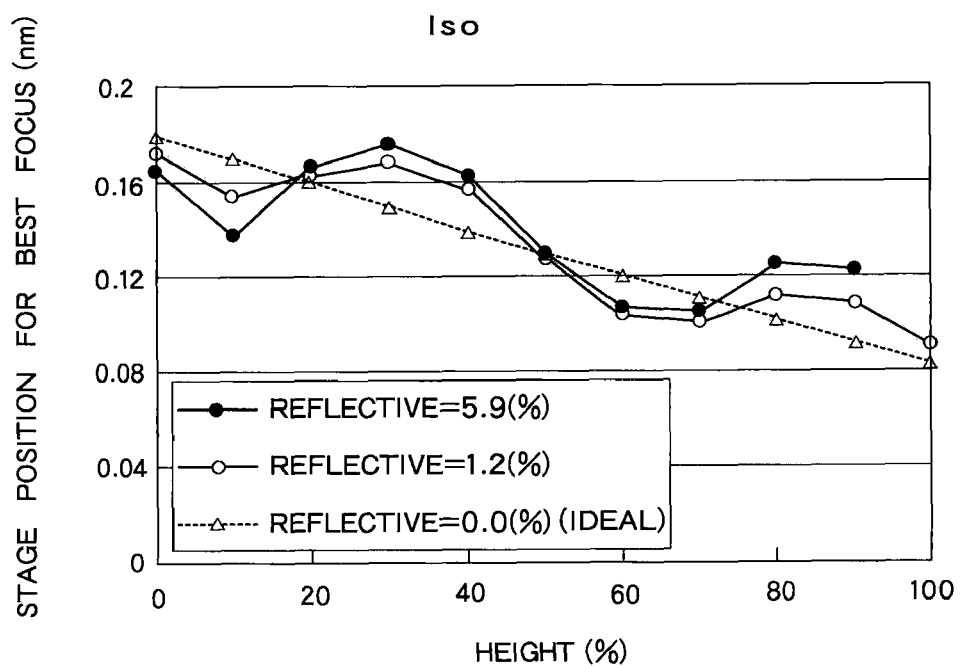
F I G. 5B

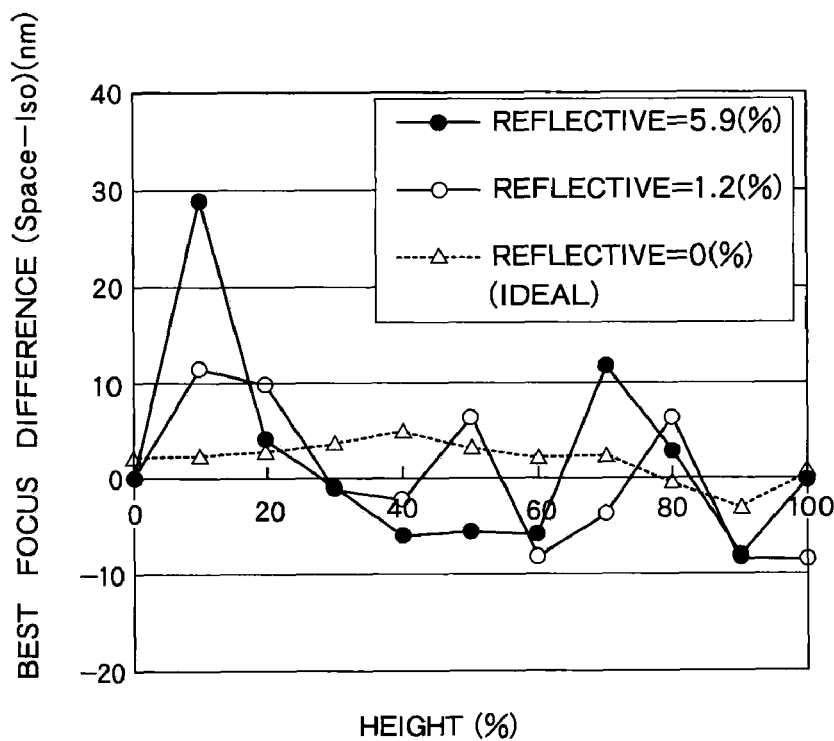
F I G. 6
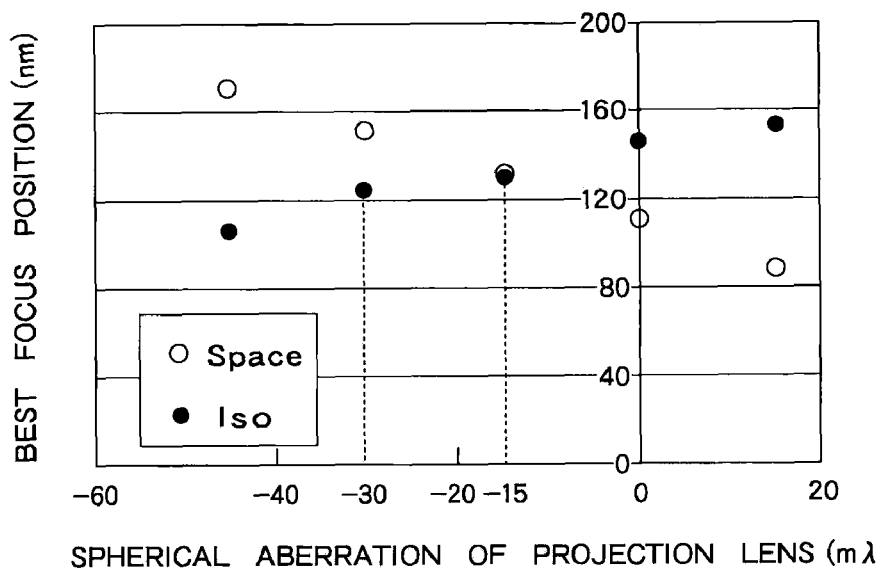
F I G. 7

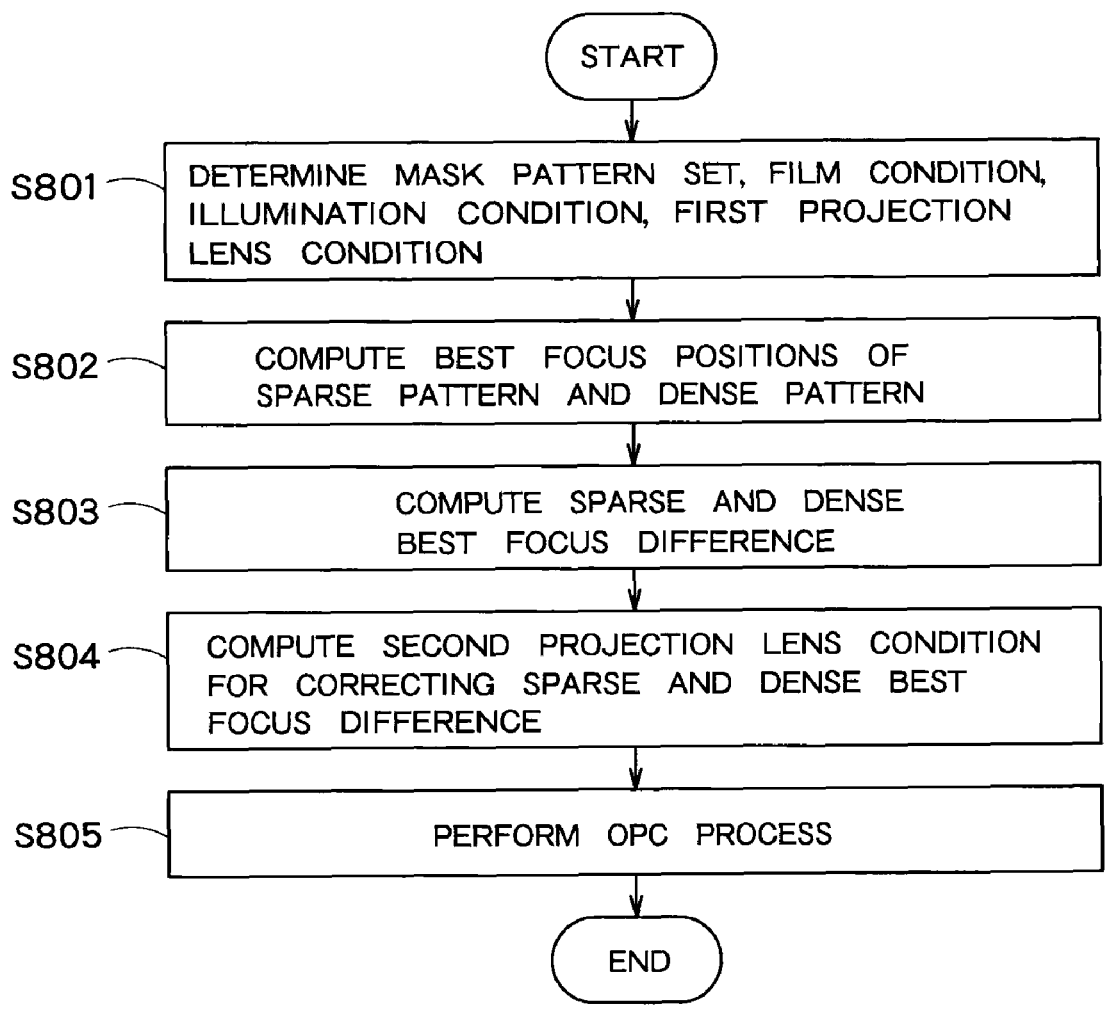
F I G. 8

EXPOSURE METHOD, MASK DATA PRODUCING METHOD, AND SEMICONDUCTOR DEVICE MANUFACTURING METHOD

CROSS REFERENCE TO RELATED APPLICATION

This application is based upon and claims benefit of priority from the Japanese Patent Application No. 2008-205279, filed on Aug. 8, 2008, the entire contents of which are incorporated herein by reference.

BACKGROUND OF THE INVENTION

The present invention relates to an exposure method, a mask data producing method, and a semiconductor device manufacturing method.

Recently, with a finer design rule of a semiconductor device, fine dimensional control is required in a lithography process for patterning a device pattern. In order to secure the fine dimensional control, even if a position of a processed substrate has a slight error with respect to an ideal position at which a photoresist is placed at a focal position of a mask pattern image in exposing the mask pattern image onto the photoresist applied to the processed substrate, it is necessary that an error allowable range of the focal position be sufficiently ensured such that the dimensions of the photoresist formed after the patterning falls within the allowable range, that is, it is necessary to sufficiently ensure a focal depth.

Further, even if an exposure amount that should be given to the photoresist has a slight error with respect to an ideal value in exposing the mask pattern image onto the photoresist applied to the processed substrate, it is necessary that an error allowable range of the exposure amount be sufficiently ensured such that the dimensions of the photoresist formed after the patterning falls within the allowable range, that is, it is necessary to sufficiently ensure a margin of the exposure amount.

However, when the exposure is actually performed to check the dimensions of the photoresist after the patterning, unfortunately the dimensional control is lowered to lower a production yield of a semiconductor device although best focus positions of a dense pattern and an isolated pattern are designed so as to be optically matched with each other. The lowering of the dimensional control is caused by a loss of the focal depth and lowering of the margin of the exposure amount. The loss of the focal depth is generated due to a mismatch between the best focus positions of the dense pattern and isolated pattern, that is, the presence of so-called sparse and dense best focus difference (hereinafter appropriately referred to as "inter-pattern best focus difference" in the broad sense). The margin of the exposure amount is lowered by an influence of a standing wave that is generated in the photoresist by interference between exposure light incident to the photoresist and exposure light reflected at an interface on a lower side of the photoresist.

In order to deal with the problem, for example, Japanese patent Application Laid-Open No. 2004-103674 proposes a technique of improving a production yield of a semiconductor integrated circuit. In the technique proposed in Japanese patent Application Laid-Open No. 2004-103674, in consideration of factors such as a focus, an exposure amount, a mask pattern shape, and a difference between pieces of exposure apparatus (such as aberration) which affect the dimension of the transferred pattern, a response model is produced by evaluating dependence of a response of an exposure condition such as a best focus shift on the pattern, and the exposure condition is previously corrected to improve the production yield.

In the technique proposed in Japanese patent Application Laid-Open No. 2004-103674, it is expected that the lowering of the yield can be restrained to the minimum level by optimizing the controllable exposure condition even if the dimensional control is lowered. It is also expected that the sparse and dense best focus difference is reduced by optimizing the exposure condition. However, a time and cost necessary to produce the response model become troublesome, and the technique proposed in Japanese patent Application Laid-Open No. 2004-103674 is hardly introduced as a direct method for restraining the generation of the sparse and dense best focus difference.

In another technique disclosed in Japanese patent Application Laid-Open No. 2006-73709, in order to avoid the lowering of the margin of the exposure amount caused by the standing wave generated by the interference of the exposure light in the photoresist, a multilayer antireflection film in which reflectivity of the exposure light is equal to or lower than 0.5% is formed between the photoresist layer and the processed film to restrain the standing wave effect.

It is noted that generally the reflectivity depends on an incident angle. Generally, the incident angle to the photoresist of the light relating to the image formation in the exposure light is increased with a finer device pattern. Even if a desired antireflection performance is obtained in a certain device pattern, frequently the desired antireflection performance is not obtained when the device pattern is shrunk. Therefore, it is necessary that a configuration of an antireflection film be readjusted every time a finer design rule is applied to the device pattern. That is why the multilayer antireflection film in which the reflectivity of the exposure light is equal to or lower than 0.5% is expected to restrain the standing wave effect.

However, the introduction of the multilayer antireflection film specializing in the decrease in reflectivity cannot avoid a process cost increase caused by increasing the number of film applying processes. Generally, in the antireflection film, not only the antireflection performance but also etching-resistant properties are required when a pattern of the photoresist layer is transferred to the processed layer in an etching process subsequent to a lithography process. Therefore, it is necessary to establish a balance between the lithography process and the etching process.

For example, the exposure process is performed using a film structure in which a lower-layer film is provided between the photoresist layer and the processed layer. The lower-layer film is proven in the etching-resistant properties although the reflectivity is set to about several percent that is not ideal.

Thus, frequently the new multilayer antireflection film specializing in the decrease in reflectivity is hardly introduced.

As described above, currently there is no effective countermeasure against the focal depth loss caused by the presence of the sparse and dense best focus difference and the lowering of the margin of the exposure amount caused by the influence of the standing wave in the photoresist, and the production yield of the most-advanced semiconductor device cannot be enhanced.

SUMMARY OF THE INVENTION

According to one aspect of the present invention, there is provided an exposure method comprising:

irradiating a mask with light based on an exposure performing condition, a first mask pattern and a second mask pattern being formed in the mask; and projecting images of the first mask pattern and second mask pattern onto a wafer through a projection lens, a lower-layer film material and a photoresist being sequentially laminated on the wafer, wherein the exposure performing condition is a condition on which, when exposure is performed on a predetermined exposure condition, the predetermined exposure condition is adjusted such that a difference between a wafer position at which a best focus is obtained for the image of the first mask pattern and a wafer position at which a best focus is obtained for the image of the second mask pattern falls within a predetermined range, the wafer position of the first mask pattern and the wafer position of the second mask pattern being obtained using film thicknesses and optical characteristics of the photoresist and the lower-layer film material.

According to one aspect of the present invention, there is provided a mask data producing method used in manufacturing a mask, the mask being irradiated with light emitted from a secondary light source during an exposure process, images of a first mask pattern and a second mask pattern being projected onto a photoresist of a wafer through a projection lens, the first mask pattern and the second mask pattern being formed in the mask, a lower-layer film material and the photoresist being laminated on the wafer, comprising:

obtaining a first position of the wafer and a second position of the wafer using film thicknesses and optical characteristics of the photoresist and the lower-layer film material, shape of the secondary light source, and predetermined aberration of the projection lens, the first position of the wafer becoming a best focus for the first mask pattern, the second position of the wafer becoming a best focus for the second mask pattern;

adjusting the aberration such that a difference between the first position and the second position falls within a predetermined range; and performing an OPC process using the adjusted aberration According to one aspect of the present invention, there is provided a semiconductor device manufacturing method used in forming a pattern on a semiconductor substrate with a mask, wherein the mask is manufactured based on mask data produced by the mask data producing method.

BRIEF DESCRIPTION OF THE DRAWINGS

FIG. 3 is a diagram illustrating examples of a sparse pattern and a dense pattern;

FIG. 4 is a diagram illustrating an example of a configuration of a multilayer film formed on a silicon substrate;

FIG. 5A is a graph illustrating an example of a best focus position;

FIG. 5B is a graph illustrating an example of a best focus position;

FIG. 6 is a graph illustrating an example of a best focus difference;

FIG. 7 is a graph illustrating a relationship between a best focus position and a lens spherical aberration; and FIG. 8 is a flowchart explaining a method of producing a mask according to a second embodiment of the invention.

DESCRIPTION OF THE EMBODIMENTS

Exemplary embodiments of the invention will be described below with reference to the drawings.

[First Embodiment]

Figure 1:
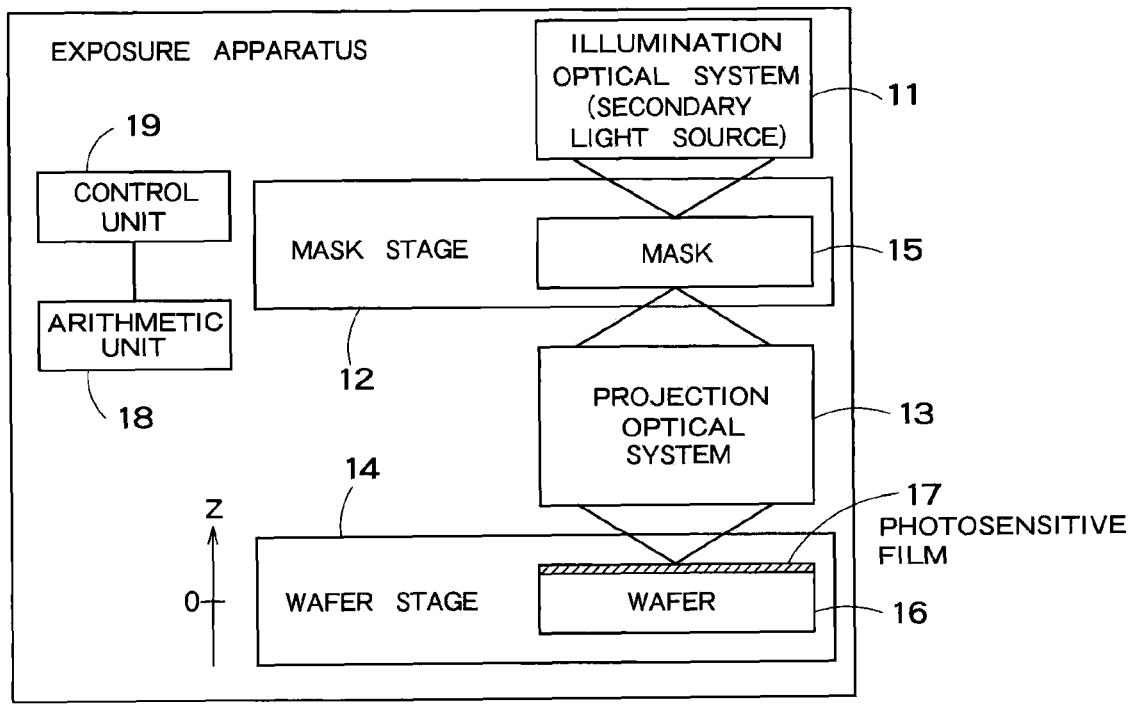
FIG. 1 is a schematic diagram illustrating an exposure apparatus according to a first embodiment of the invention.

FIG. 1 is a schematic diagram illustrating an exposure apparatus according to a first embodiment of the invention. The exposure apparatus includes an illumination optical system (secondary light source) 11, a mask stage 12, a projection optical system (lens) 13, and a wafer stage 14.

A mask 15 is placed on the mask stage 12, and the mask 15 has a pattern surface in which a pattern to be exposed is formed. A wafer 16 is placed on the wafer stage 14. A single layer or plural layers including a photosensitive film 17 are laminated on the wafer 16.

The light emitted from the illumination optical system 11 forms an image of the mask pattern near an upper surface of the wafer 16 through the mask 15 and the lens 13. In FIG. 1, a coordinate system Z indicates a level of the wafer stage 14, and it is defined that a positive direction is a direction in which the projection lens 13 is brought close. A relative displacement from a reference point may be defined as the level of the wafer stage 14 in the following discussion on the level of the wafer stage that gives a best focus of the mask pattern image in the photosensitive film 17. Therefore, an origin of the level of the wafer stage 14 may be set to any predetermined position. The best focus shall mean a center value of a focus allowable range where dimensions of a photoresist formed after patterning falls within an allowable range. For example, the best focus is a focus at which a line width of a line pattern becomes the maximum.

The exposure apparatus also includes an arithmetic unit 18 and a control unit 19. The arithmetic unit 18 computes a best focus position of the wafer stage 14 in order to form the image of the mask pattern formed in the mask 15 onto the photosensitive film 17 on the wafer 16. The control unit 19 moves the mask stage 12 and the wafer stage 14, and the control unit 19 adjusts an aberration of the lens 13.

Figure 2:
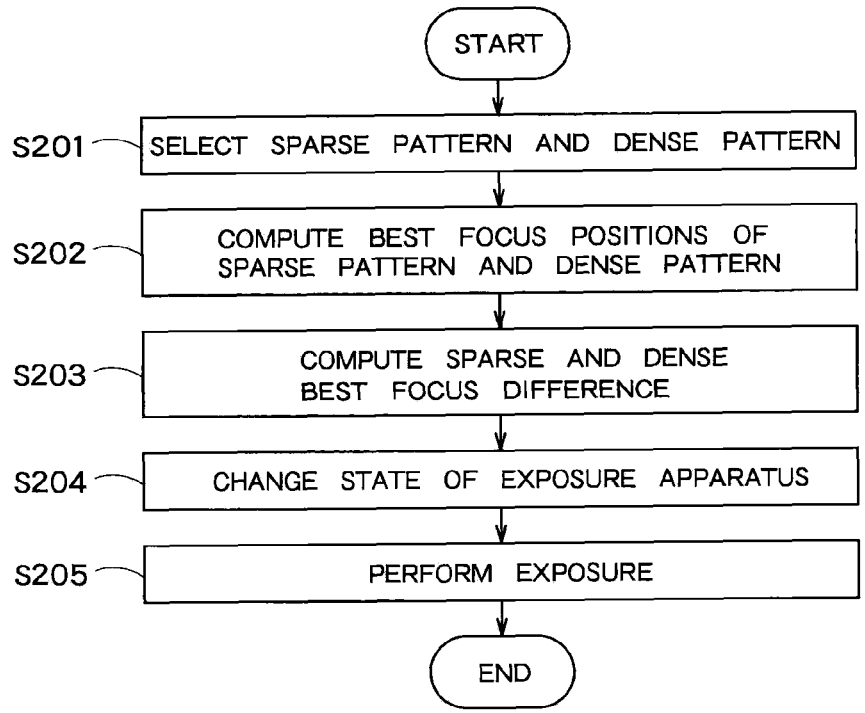
FIG. 2 is a flowchart explaining an exposure method of the first embodiment.

An exposure method with the exposure apparatus will be described with reference to a flowchart of FIG. 2. The inventors found that reflection of the exposure light at an interface on the lower side of the photoresist has an influence on a sparse and dense best focus difference. In the exposure method of the first embodiment, the exposure is performed while the sparse and dense best focus difference is reduced in consideration of reflectivity of the exposure light.

(Step S201)

A sparse pattern and a dense pattern are selected from the patterns formed in the mask 15. As used herein, the sparse pattern shall mean a line portion Iso in a peripheral circuit pattern as illustrated in FIG. 3, and the dense pattern shall mean a space portion Space in a cell pattern.

The line portion Iso has the minimum focal depth in the sparse pattern, and the space portion Space has the minimum focal depth in the dense pattern. In order to ensure the focal depth enough to transfer the pattern formed in the mask, it is necessary that the best focus position of the line portion Iso is matched with that of the space portion Space.

(Step S202)

The best focus position is computed for each of the sparse pattern and dense pattern selected in Step S201. In computing the best focus position, a mask structure, an illumination condition, a Post Exposure Bake (PEB) condition, a development condition, and a film structure of a film system formed on the wafer are fed to compute a simulation for obtaining a light intensity distribution of the image formed by the projection lens. At this point, the light reflected from the interface on the lower side of the photoresist is reflected on the light intensity distribution in the photoresist using an algorithm well known as a Transfer Matrix Method for reproducing a multiple interference effect generated by light reflected from each interface in a multilayer film system.

The mask structure includes pieces of information such as light transmission of a light blocking portion and light transmission of a transmission portion. The illumination condition is a distribution of luminance of the secondary light source or the like. For example, the illumination condition includes information on use of a quadrupole illumination.

The PEB condition includes pieces of information such as a process time and a PEB temperature (bake temperature after exposure).

The PEB temperature is a major factor for determining a resist shape, because the PEB temperature has an influence on a neutralizing reaction speed of a photo acid generator. The PEB condition also includes a diffusion constant for determining a diffusion rate of acid in the resist.

The development condition includes pieces of information such as a developer temperature and a development time.

The film structure includes pieces of information such as an optical characteristic (refractive index n and extinction coefficient k) and a film thickness of each film of the multilayer film formed on the wafer. For example, the film structure includes pieces of information on the optical characteristic and film thickness of each layer when a processed material layer 42, an antireflection film 43, a photoresist 44, and a protective film 45 are sequentially formed on a silicon substrate 41 as illustrated in FIG. 4.

Because a small amount of exposure light reaches the layers located below the antireflection film 43 in the case of the large extinction coefficient k of the antireflection film 43, the optical constants and film thicknesses of the protective film 45, photoresist 44, and antireflection film 43 are used to compute the best focus position. In the case of the small extinction coefficient k of the antireflection film 43, the optical constants and film thicknesses of the layers located below the antireflection film 43 are used to compute the best focus position, and sometimes the optical constant of the silicon substrate 41 is also used to compute the best focus position.

When a material for the antireflection film 43 is changed, the reflectivity of the exposure light is changed at the interface on the lower side of the photoresist. In the following description, the reflectivity of the exposure light is changed at the interface on the lower side of the photoresist. The change in reflectivity of the exposure light is achieved by changing the material for the antireflection film 43.

FIG. 5A and FIG. 5B respectively illustrates a wafer stage position when the patterns of the line portion Iso and space portion Spase are formed into the photoresist on the wafer with the best focus. FIG. 5A and FIG. 5B respectively illustrates the wafer stage position when the reflectivity is 0%, 1.2%, and 5.9% at the interface between the photoresist 44 and the antireflection film 43.

As used herein, the reflectivity shall mean a value for ArF having a wavelength of 193 nm incident to the photoresist in water at an incident angle of 37.5°, which has the largest contribution to the image formation of a line and space pattern having a half pitch of 56 nm.

In FIG. 5A and FIG. 5B, a horizontal axis indicates a level at a point on which the dimensions are focused in the photoresist. For example, in the horizontal axis, 0% indicates a bottom of the photoresist, and 100% indicates a top of the photoresist. That is, the focusing point is virtually determined in the photoresist, and the change in dimension is checked at the focusing point when the level of the wafer stage is changed, thereby obtaining the wafer stage position that gives the best focus of FIG. 5A and FIG. 5B.

At this point, the wafer stage position at which the dimension of the line width becomes the maximum is defined as the best focus for the line portion Iso, and the wafer stage position at which the dimension of the space width becomes the maximum is defined as the best focus for the space portion Space.

In the case of the reflectivity of 0%, the wafer stage position that gives the best focus tends to be lowered at a constant rate as the dimension focusing point is raised in the photoresist. This shows that the best focus position measured as a distance from the projection lens is not changed even if the best focus is realized at any level in the photoresist pattern.

The line portion Iso is equal to the space portion Space in the tendency. Therefore, it is found that the wafer stage position that gives the best focus of the line portion Iso is similar to the wafer stage position that gives the best focus of the space portion Space.

On the other hand, in the case of the reflectivities of 1.2% and 5.9%, a relationship between the level of the dimension focusing point in the photoresist and the wafer stage position that gives the best focus tends to be swung. Therefore, it is found that the best focus position measured as the distance from the projection lens is shifted (fluctuated) toward both the positive direction and the negative direction.

Although the swing tendency is observed in both the line portion Iso and the space portion Space, the swing tendency in the line portion Iso is not matched with the swing tendency in the space portion Space. That is, it is expected that the difference in wafer stage position that gives the best focus is generated between the line portion Iso and the space portion Space.

(Step S203)

The difference in a best focus position between the line portion Iso and the space portion Space is computed. FIG. 6 illustrates the difference in best focus position between the line portion Iso and the space portion Space illustrated in FIG. 5. It is empirically known that the actual best focus position is reproduced well when the level of the dimension focusing point is set to 10% of the film thickness of the photoresist. Therefore, in the first embodiment, the best focus position of the level of 10% of the film thickness is dealt with as the actual best focus position.

As can be seen from FIG. 6, at the level of 10% of the film thickness, the best focus difference is about 12 nm in the reflectivity of 1.2%, and the best focus difference is about 30 nm in the reflectivity of 5.9%. The best focus difference is increased as the reflectivity is increased. Usually the focal depths of the line portion ISO and space portion Space are realized by devisal on the illumination condition or mask condition side so as not to fall below the necessary focal depth when the whole of the mask pattern is transferred. However, the best focus difference is not presumed. Therefore, in order to ensure the focal depth of 120 nm as the whole of the mask pattern, the design is made such that the focal depths of the line portion Iso and space portion Space are set to 120 nm. However, when the best focus difference of 30 nm is generated as suggested from FIG. 6, the focal depth of the mask pattern is reduced to 90 nm as a whole.

(Step S204)

The state of the exposure apparatus is changed such that the best focus difference is decreased, for example, such that the best focus difference becomes a value within a range of −1 to +1 nm. At this point, the state of the exposure apparatus is in a spherical aberration of the projection lens 13. FIG. 7 shows a relationship between the best focus positions of the line portion Iso and space portion Space and the spherical aberration. When the spherical aberration is intentionally shifted toward the positive direction, the best focus position of the line portion Iso is raised while the best focus position of the space portion Space is lowered.

As can be seen from FIG. 7, when the best focus positions of the line portion Iso and space portion Space are read in the spherical aberrations of −30 mλ and −15 mλ, a rate at which the best focus positions of the line portion Iso and space portion Space are brought close to each other is about 30 nm in the spherical aberration of 15 mλ.

In cases where the projection lens has the spherical aberration of 3 mλ, which is set in performing the exposure on the film condition (best focus difference is 30 nm) of the reflectivity of 5.9% illustrated in FIG. 6, when the spherical aberration is excessively given by +15 mλ to change the spherical aberration to 18 mλ, the best focus difference of 30 nm is substantially corrected to 0 nm to ensure the focal depth of 120 nm.

In cases where the projection lens has the spherical aberration of −2 mλ, which is set in performing the exposure on the film condition (best focus difference is 12 nm) of the reflectivity of 1.2%, when the spherical aberration is excessively given by +6 mλ to change the spherical aberration to +4 mλ, the best focus difference of 12 nm is substantially corrected to 0 nm to ensure the focal depth of 120 nm.

(Step S205)

The exposure is performed in the exposure apparatus state changed in Step S204.

Then a development process is performed to pattern the processed material layer 42 with the photoresist 44 as the mask.

Thus, the sparse and dense best focus difference is obtained in consideration of the reflectivity to the exposure light based on the optical characteristic of each film constituting the multilayer film system containing the photoresist and the film materials below the photoresist, and the sparse and dense best focus difference is reduced by changing the exposure apparatus state, so that the focal depth can be improved to enhance the production yield of the semiconductor device.

In computing the best focus position of the first embodiment, the level of 10% of the film thickness of photoresist is set to the dimension focusing point, the level of the wafer stage that gives the best focus in the dimension at the level of 10% of the film thickness is assumed as the best focus position. However, the level of the dimension focusing point in the photoresist is not limited to 10% of the film thickness. Desirably the level of the dimension focusing point is corrected when the dimension focusing point corresponds to the actual best focus position. It is generally known that a three-dimensional structure of the mask has an influence on the best focus position as an aspect of a so-called "mask 3D effect". A change in light diffraction caused by the three-dimensional structure of the mask may be considered in computing the best focus position.

The best focus difference may be obtained by an exposure experiment using the optical characteristics.

It is known that the reflectivity at the interface between the photoresist and the layer beneath the photoresist is changed by optical constants of the films located below the photoresist. Accordingly, when the layers except for the processed material layer 42 and silicon substrate 41 located below the photoresist, preferably the optical constants and film thicknesses of all the layers located below the photoresist are obtained to compute the reflectivity and the best focus difference.

The layers, such as the protective film 45, which are located above the photoresist and the presence of liquid medium (such as water) in immersion exposure also become a factor for determining the best focus difference. Therefore, desirably the optical constants and the film thicknesses are previously obtained to compute the reflectivity and the best focus difference.

In the first embodiment, the spherical aberration of the lens is used as the exposure apparatus state that is changed to correct the best focus difference. The exposure apparatus state may include other aberrations such as astigmatism and 4θ aberration, or a lens may be designed and produced so as to include a predetermined amount of spherical aberration or spherical aberration component of polarization. The lens having the predetermined amount of spherical aberration or spherical aberration component of the polarization can be designed by an existing method, that is, by changing a curvature of a surface of an element lens constituting the lens or by changing a type or a film thickness of the antireflection film of the element lens. Sometimes the condition that obtains the same effect as the first embodiment can be obtained by changing a numerical aperture of the projection lens 13 and the illumination conditions such as the luminance distribution of the secondary light source.

The sparse and dense best focus difference that is of the difference in best focus position between the sparse pattern and the dense pattern is corrected in the first embodiment. However, the difference in best focus position is not limited to the sparse pattern and the dense pattern, but the difference in best focus position can be applied to a best focus difference between patterns having different pattern shapes.

In the first embodiment, when the need to change the film condition or the liquid medium arises in correcting the best focus difference to perform the exposure, the best focus difference is computed (predicted) again on the condition after the change, and desirably the spherical aberration of the lens is adjusted such that the best focus difference is corrected.

[Second Embodiment]

An Optical Proximity Effect Correction (OPC) process in a mask producing method according to a second embodiment of the invention will be described with reference to a flowchart of FIG. 8.

(Step S801)

A mask pattern set, the film condition, the illumination condition, and a first projection lens condition are determined. As used herein, the mask pattern set shall mean a sparse pattern representing the sparse patterns included in the produced mask pattern and a dense pattern representing the dense patterns, respectively. As with the process in Step S201 of the first embodiment, the region where the focal depth is minimized is selected in a method for selecting the representative pattern. The region having the small focal depth is preferentially selected in selecting the plural representatives.

(Step S802)

The best focus positions of the sparse pattern and dense pattern on the first projection lens condition are computed in consideration of the reflectivity of exposure light. For example, the process similar to that in Step S202 of the first embodiment is performed.

The best focus positions may be obtained by performing experimental exposure under multiple conditions, each condition including a different focus, and measuring a dimension of a resist pattern.

(Step S803)

The difference between the best focus positions computed in Step S802 is computed (best focus difference).

(Step S804)

A second projection lens condition is obtained in order to reduce the best focus difference computed in Step S803. For example, as with the process in Step S204 of the first embodiment, the correction amount of spherical aberration is obtained in order to reduce the best focus difference, and the second projection lens condition is obtained while the correction amount of spherical aberration is added.

(Step S805)

The OPC process is performed to design circuit pattern data formed in the processed material layer while the projection lens condition is set to the second projection lens condition, thereby obtaining the mask data. The OPC process shall mean a general optical proximity correction process in which, in producing the data to create the mask pattern data from the design circuit pattern data formed in the processed material layer, the design is made while the correction of the optical proximity effect is previously included in consideration of the fact that the pattern shape is changed on the photoresist due to the optical proximity effect in exposing the mask pattern.

The mask is produced based on the mask data obtained in the above-described manner. The mask is produced on the assumption that the exposure is performed on the exposure condition for correcting the best focus difference between the sparse pattern and the dense pattern. When the exposure is performed on the second projection lens condition using the mask, the focal depth is sufficiently ensured, and the dimensions of the formed pattern becomes the desired values to enhance the yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask data producing method used in manufacturing a mask, the mask being irradiated with light emitted from a secondary light source during an exposure process, images of a first mask pattern and a second mask pattern being projected onto a photoresist of a wafer through a projection lens, the first mask pattern and the second mask pattern being formed in the mask, a lower-layer film material and the photoresist being laminated on the wafer, comprising:

obtaining a first position of the wafer and a second position of the wafer using film thicknesses and optical characteristics of the photoresist and the lower-layer film material, shape of the secondary light source, and predetermined aberration of the projection lens, the first position of the wafer becoming a best focus for the first mask pattern, the second position of the wafer becoming a best focus for the second mask pattern;

adjusting the aberration such that a difference between the first position and the second position falls within a predetermined range; and performing an OPC process using the adjusted aberration.

2. The mask data producing method according to claim 1, comprising:

creating an experimental OPC model base on a configuration information of a resist pattern set, the resist pattern set being formed by exposing a mask pattern set including the first mask pattern and the second mask pattern under conditions that the aberration is adjusted; and performing the OPC process using the experimental OPC model.

3. The mask data producing method according to claim 2, wherein the experimental OPC model includes an optics model portion based on film thicknesses and optical characteristics of the photoresist and the lower-layer film material, shape of the secondary light source, and adjusted aberration of the projection lens, and an experimental model portion which corrects a difference between a predicted shape of the resist pattern set using the optics model portion and a shape of the resist pattern set formed by exposing the mask pattern set.

4. The mask data producing method according to claim 1, wherein the optical characteristic is a refractive index and an extinction coefficient to a wavelength of the light.

5. The mask data producing method according to claim 1, wherein the aberration is at least one of spherical aberration, astigmatism, and 4θ aberration.

6. The mask data producing method according to claim 1, wherein the best focus is a center value of a focus range where dimensions of the image of the mask pattern formed in the photoresist falls within a predetermined range.

7. A semiconductor device manufacturing method used in forming a pattern on a semiconductor substrate with a mask, wherein the mask is manufactured based on mask data produced by the method according to claim 1.

* * * * *